United States Patent
Yamashita

(10) Patent No.: US 7,718,978 B2
(45) Date of Patent: May 18, 2010

(54) ION SOURCE AND METHOD FOR OPERATING SAME

(75) Inventor: Takatoshi Yamashita, Kyoto (JP)

(73) Assignee: Nissin Ion Equipment Co., Ltd., Kyoto (JP)

( * ) Notice: Subject to any disclaimer, the term of this patent is extended or adjusted under 35 U.S.C. 154(b) by 148 days.

(21) Appl. No.: 12/097,779

(22) PCT Filed: May 17, 2007

(86) PCT No.: PCT/JP2007/060164

§ 371 (c)(1),
(2), (4) Date: Jun. 17, 2008

(87) PCT Pub. No.: WO2007/132922

PCT Pub. Date: Nov. 22, 2007

(65) Prior Publication Data
US 2009/0001290 A1    Jan. 1, 2009

(30) Foreign Application Priority Data
May 17, 2006    (JP)    ............... 2006-137839

(51) Int. Cl.
*H01J 49/10*    (2006.01)
*H01J 37/32*    (2006.01)
*H01J 49/14*    (2006.01)

(52) U.S. Cl. ............... 250/423 R; 250/492.3; 315/111.21; 315/111.31; 315/111.41; 315/111.81; 118/723 HC

(58) Field of Classification Search ............. 250/423 R, 250/492.3; 315/111.21, 111.31, 111.41, 315/111.81; 118/723 HC
See application file for complete search history.

(56) References Cited

U.S. PATENT DOCUMENTS 6,755,150 B2 *    6/2004    Lai et al. ............... 118/723 I (Continued)

FOREIGN PATENT DOCUMENTS

JP    7-211275    8/1995

(Continued)

OTHER PUBLICATIONS

International Search Report (English & Japanese) for PCT/JP2007/060164 mailed Jul. 10, 2007) (10 pages).

(Continued)

*Primary Examiner*—Nikita Wells
(74) *Attorney, Agent, or Firm*—Osha • Liang LLP

(57) ABSTRACT

An ion source is provided that can generate an ion beam in which the width is wide, the beam current is large, and the uniformity of the beam current distribution in the width direction is high, and that can prolong the lifetime of a cathode. The ion source 2a has: a plasma generating chamber 6 having an ion extraction port 8 extending in the X direction; a magnet 14 which generates a magnetic field 16 extending along the X direction, in the plasma generating chamber 6; indirectly-heated cathodes 20 which are placed respectively on the both sides of the plasma generating chamber 6 in the X direction, and which are used for generating a plasma i0 in the chamber 6, and increasing or decreasing the density of the whole of the plasma 10; and plural filament cathodes 32 which are juxtaposed in the X direction in the plasma generating chamber 6, and which are used for generating the plasma i0 in the chamber 6, and controlling the density distribution of the plasma 10.

8 Claims, 4 Drawing Sheets

U.S. PATENT DOCUMENTS

2009/0114815 A1 * 5/2009 Vanderberg et al. ......... 250/288

FOREIGN PATENT DOCUMENTS

| | | |
|---|---|---|
| JP | 8-111198 | 4/1996 |
| JP | 11-25872 | 1/1999 |
| JP | 2000-315473 | 11/2000 |
| JP | 3758667 | 1/2006 |

OTHER PUBLICATIONS

Written Opinion of ISA (Japanese) mailed Jul. 10, 2007 (5 pages).
Patent Abstracts of Japan 2006-324050 dated Nov. 30, 2006 (1 page).
Patent Abstracts of Japan 11-025872 dated Jan. 29, 1999 (1 page).
Patent Abstracts of Japan 2000-315473 dated Nov. 14, 2000 (1 page).
Patent Abstracts of Japan 07-211275 dated Aug. 11, 1995 (1 page).
Patent Abstracts of Japan 08-111198 dated Apr. 30, 1996 (1 page).

* cited by examiner

ION SOURCE AND METHOD FOR OPERATING SAME

TECHNICAL FIELD

The present invention relates to an ion source which is to be used in an ion beam irradiating apparatus for irradiating a target with an ion beam to apply a process such as ion implantation, or the like, and also to a method of operating it, and more specifically to an ion source which generates an ion beam having a ribbon-like (this is called also a sheet-like or a strip-like, the same shall apply hereinafter) shape where the dimension in the X direction in a plane intersecting with the traveling direction is larger than that in the Y direction perpendicular to the X direction, and also to a method of operating it.

BACKGROUND ART

In an ion source which generates a ribbon-like ion beam, usually, plural cathodes are used in order to generate a plasma of high uniformity.

The lifetimes of the cathodes depend on sputter due to collisions of ions in a plasma, thermal evaporation, consumption due to a reaction with a source gas for generating a plasma, and the like.

Among cathodes, in an indirectly-heated cathode in which a cathode member is heated by a filament, usually, the cathode member can be made thicker than a filament cathode (in other words, a directly-heated cathode, the same shall apply hereinafter). Therefore, an indirectly-heated cathode has an advantage that the lifetime can be prolonged. An example of an ion source in which two such indirectly-heated cathodes are used is disclosed in Patent Reference 1.

By contrast, a filament cathode is simple in structure, and hence has an advantage that many filament cathodes can be disposed in a relatively easy manner. An example of an ion source in which a plurality of such filament cathodes are used is disclosed in Patent Reference 2.

Patent Reference 1: JP-A-11-25872 (Paragraph 0015, FIG. 2)
Patent Reference 2: JP-A-2000-315473 (Paragraph 0003, FIG. 8)

DISCLOSURE OF THE INVENTION

Problems that the Invention is to Solve

In order to increase the width (the width in the longitudinal direction, the same shall apply hereinafter) of a ribbon-like ion beam generated from an ion source, usually, the number of cathodes must be increased in accordance with it. This is conducted in order to improve the uniformity of the plasma density distribution in the ion source, and therefore that of the beam current density distribution in the width direction of the ion beam.

In the case where an indirectly-heated cathode is used, however, the lifetime of the cathode can be prolonged as described above, but is hardly disposed in a large number because an indirectly-heated cathode is more complex in structure than a filament cathode. Therefore, it is difficult to enhance the uniformity of the plasma density distribution, and hence that of the beam current distribution in the width direction of an ion beam.

By contrast, in the case where a filament cathode is used, a large number of cathodes can be disposed in a relatively easy manner as described above, but the lifetimes of the filament cathodes are short. When the plasma density is enhanced to increase the ion beam current, particularly, the lifetimes of the filament cathodes are further shortened.

Also in the case where a filament cathode is used, it is known that, when a voltage to be applied between the filament cathode and the anode is suppressed to a low value (for example, about 20 V), the amount of sputtering is reduced, and the consumption is restrained. When an operation is performed in this manner, however, the plasma density cannot be increased, and an ion beam of a large beam current cannot be generated.

Therefore, it is a principal object of the invention to provide an ion source that can generate an ion beam in which the width is wide, the beam current is large, and the uniformity of the beam current distribution in the width direction is high, and that can prolong the lifetime of a cathode, and a method of operating it.

Means for Solving the Problems

One of the ion sources of the invention is an ion source which generates an ion beam having a shape where a dimension in an X direction in a plane intersecting with a traveling direction is larger than a dimension in a Y direction perpendicular to the X direction, wherein the ion source comprises:

a plasma generating chamber which is a chamber that functions also as an anode, and that is used for internally generating a plasma, the chamber having an ion extraction port extending in the X direction;

a magnet which generates a magnetic field extending along the X direction, in the plasma generating chamber;

indirectly-heated cathodes which are placed respectively on both sides of the plasma generating chamber in the X direction, and which are used for generating the plasma in the plasma generating chamber, and increasing or decreasing a density of a whole of the plasma; and plural filament cathodes which are juxtaposed in the X direction in the plasma generating chamber, and which are used for generating the plasma in the plasma generating chamber, and controlling a density distribution of the plasma.

According to the ion source, the density of the whole plasma can be increased or decreased by using the indirectly-heated cathodes. Therefore, consumptions of the filament cathodes can be suppressed by lowering the voltage applied to the filament cathodes, and decreasing the currents flowing therethrough. Moreover, controls such as an improvement of the uniformity of the plasma density distribution can be performed by using the plural filament cathodes.

In place of the placement where the indirectly-heated cathodes are placed respectively on both sides of the plasma generating chamber in the X direction, an indirectly-heated cathode may be placed on one side in the X direction, and a reflecting electrode may be placed on an opposite side.

The method of operating an ion source according to the invention is characterized in that, in the above-described ion source, the density of the whole of the plasma generated in the plasma generating chamber is increased or decreased by using the indirectly-heated cathode, and the density distribution of the plasma generated in the plasma generating chamber is controlled by using the plural filament cathodes.

Effects of the Invention

According to the inventions set forth in claims 1, 2, and 4, the density of the whole plasma can be increased or decreased by using the indirectly-heated cathode. Therefore, consumptions of the filament cathodes can be suppressed by lowering the voltage applied to the filament cathodes, and decreasing the current flowing therethrough. Moreover, controls such as an improvement of the uniformity of the plasma density distribution can be performed by using the plural filament cathodes. As a result, an ion beam in which the width is wide, the beam current is large, and the uniformity of the beam current distribution in the width direction is high can be generated. Moreover, the lifetimes of the cathodes can be prolonged.

According to the invention set forth in claim 3, a magnetic field produced by the magnet can be enhanced by magnetic fields produced by currents flowing through the filament cathodes, and hence the magnetic field in the plasma generating chamber can be enhanced, whereby the electron confining performance due to the magnetic field can be improved.

As a result, a further effect is achieved that the efficiency of ionizing a source gas is enhanced, and the increase of the plasma density and hence that of the ion beam current are facilitated.

Figure 1:
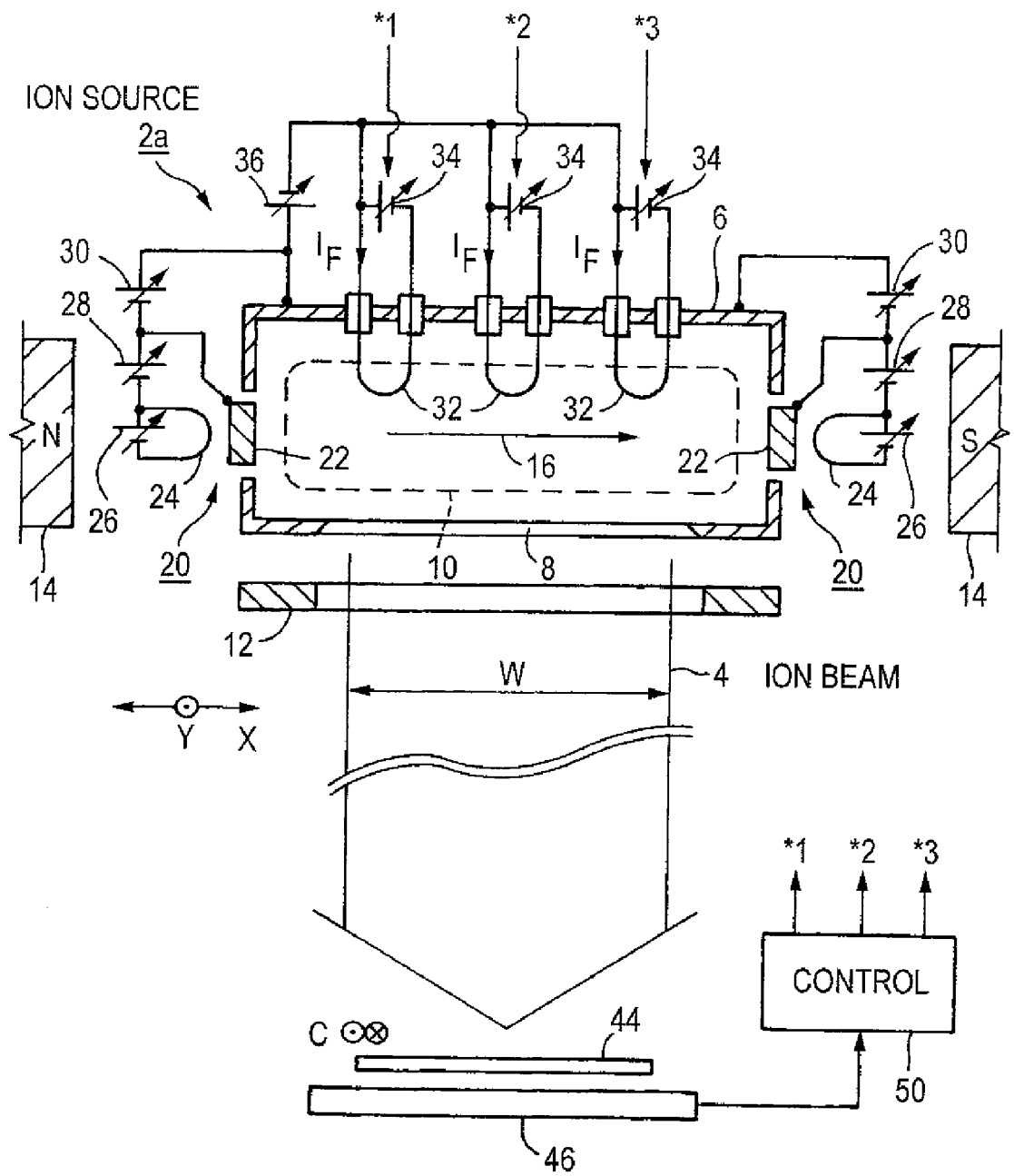
FIG. 1 is a view showing an example of an ion beam irradiating apparatus comprising the ion source of the invention.

DESCRIPTION OF REFERENCE NUMERALS AND SIGNS 2a, 2b ion source
4 ion beam
6 plasma generating chamber
8 ion extraction port
10 plasma
14 magnet
16 magnetic field
20 indirectly-heated cathode
22 cathode member
24 filament
32 filament cathode
38 magnetic field
44 target

BEST MODE FOR CARRYING OUT THE INVENTION

FIG. 1 is a view showing an example of an ion beam irradiating apparatus comprising the ion source of the invention. The ion beam irradiating apparatus comprises an ion source 2a which generates an ion beam 4 having a so-called ribbon-like shape where the dimension in the X direction in a plane intersecting with the traveling direction is larger than that in the Y direction perpendicular to the X direction. Although the ion beam has a ribbon-like shape, this does not mean that the thickness is as thin as paper.

For example, the width W in the X direction of the ion beam 4 is about 35 cm to 50 cm, and the thickness in the Y direction of the ion beam 4 is about 5 cm to 10 cm. The dimensions are not restricted to these values.

The ion beam 4 extracted from the ion source 2a impinges on a target 44 through, as required, a mass separator, an accelerating/decelerating device, and the like. Therefore, a process such as ion implantation, or the like can be applied to the target 44. In the case where ion implantation is performed, the apparatus is also called an ion implanting apparatus. For example, the target 44 is a semiconductor substrate, a glass substrate, or the like.

In this example, the target 44 is reciprocally driven in a mechanical manner by a target driving apparatus (not shown) in the direction of an arrow C intersecting with the direction of the width W of the ion beam 4. The width W of the ion beam 4 is slightly larger than the dimension in the same direction of the target 44. This and the above-described reciprocal driving enable the whole face of the target 44 to be irradiated with the ion beam 4.

The ion source 2a comprises a plasma generating chamber 6 which is a chamber that functions also as an anode, that is used for internally generating a plasma 10, and that has an ion extraction port 8 extending in the X direction. For example, the ion extraction port 8 is an ion extraction slit. For example, the plasma generating chamber 6 has a rectangular parallelepiped box-like shape. A source gas (including the case of steam) for generating the plasma 10 is introduced into the plasma generating chamber 6.

A magnet 14 which generates a magnetic field 16 along the X direction in the plasma generating chamber is disposed outside the plasma generating chamber 6. For example, the magnet 14 is an electromagnet having magnetic poles on the both sides across the plasma generating chamber 6 in the X direction. Alternatively, the magnet may be a permanent magnet. The direction of the magnetic field 16 may be opposite to the illustrated one.

The magnetic field 16 performs functions of confining electrons in the plasma generating chamber 6, preventing the electrons from colliding against the wall of the plasma generating chamber 6, and enhancing the efficiency of ionizing the source gas, thereby increasing the plasma density. In place of the above-described magnet 14, a magnet which generates a cusp magnetic field along the X direction in the plasma generating chamber 6 may be disposed.

Indirectly-heated cathodes 20 which emit thermal electrons into the plasma generating chamber 6 are disposed on the both sides of the plasma generating chamber 6 in the X direction, respectively. In the embodiment, namely, two indirectly-heated cathodes 20 are disposed. The indirectly-heated cathodes 20 are used for generating the plasma 10 in the plasma generating chamber 6, and controlling the density of the whole of the plasma 10. In the control, specifically, the density of the whole plasma 10 is increased or decreased.

Each of the indirectly-heated cathodes 20 has a cathode member 22 which is heated to emit thermal electrons, and a filament 24 which heats the cathode member 22. The thickness of the cathode member 22 can be easily increased. A more specific structure for placing the cathode member 22 and the filament 24 with respect to the plasma generating chamber 6 is shown in a simplified manner in FIG. 1 (and FIG. 5 which will be described later). For example, a known structure such as disclosed in Japanese Patent No. 3,758,667 may be employed.

Filament power sources 26 which heat the filaments 24 are connected to the filaments, respectively. The filament power sources 26 may be DC power sources as in the illustrated example, or AC power sources.

Between the filaments 24 and the cathode members 22, DC bombardment power sources 28 which accelerate thermal electrons emitted from the filaments 24 toward the cathode members 22 to heat the cathode members 22 by using impacts of the thermal electrons are connected while the cathode members 22 are set to the positive side, respectively.

Between the cathode members 22 and the plasma generating chamber 6, DC arc power sources 30 which accelerate thermal electrons emitted from the cathode members 22, which ionize the source gas introduced into the plasma generating chamber 6, and which cause an arc discharge to be generated in the plasma generating chamber 6, to generate the plasma 10 are connected while the cathode members 22 are set to the negative side, respectively.

The density of the whole plasma 10 can be increased or decreased by increasing or decreasing one or more of the outputs of the power sources 26, 28, 30.

Plural filament cathodes 32 which emit thermal electrons into the plasma generating chamber 6 are juxtaposed in the X direction on the side in the plasma generating chamber 6 and opposed to the ion extraction port 8. The number of the filament cathodes 32 is not restricted to three shown in FIG. 1 or four shown in FIG. 2, but may be determined in accordance with the precision of the control of the plasma density distribution, the width W of the ion beam 4, and the like. The filament cathodes 32 are used for generating the plasma 10 in the plasma generating chamber 6 and controlling the density distribution of the plasma 10. In the control, for example, the density distribution of the plasma 10 is uniformed.

Figure 2:
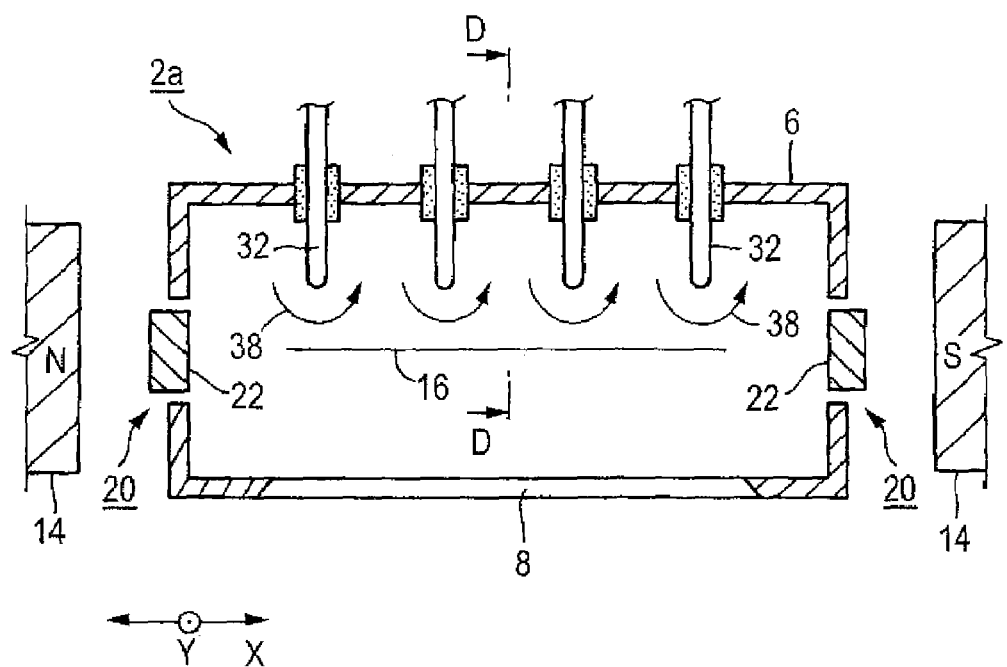
FIG. 2 is a view showing another example of the way of placement of filament cathodes.
Figure 3:
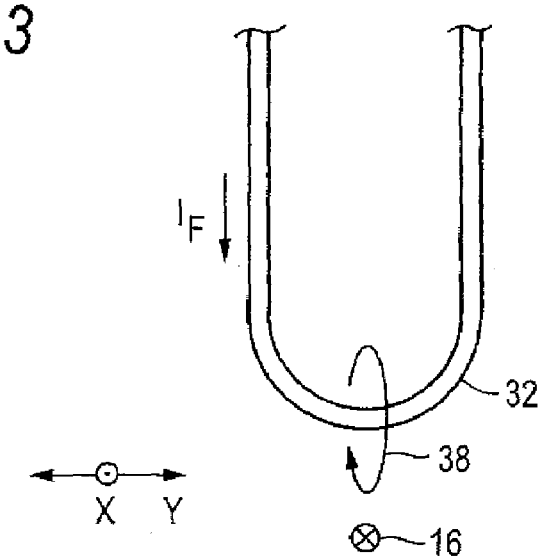
FIG. 3 is an enlarged view of a filament cathode in FIG. 2 as seen in the direction of the line D-D.
Figure 4:
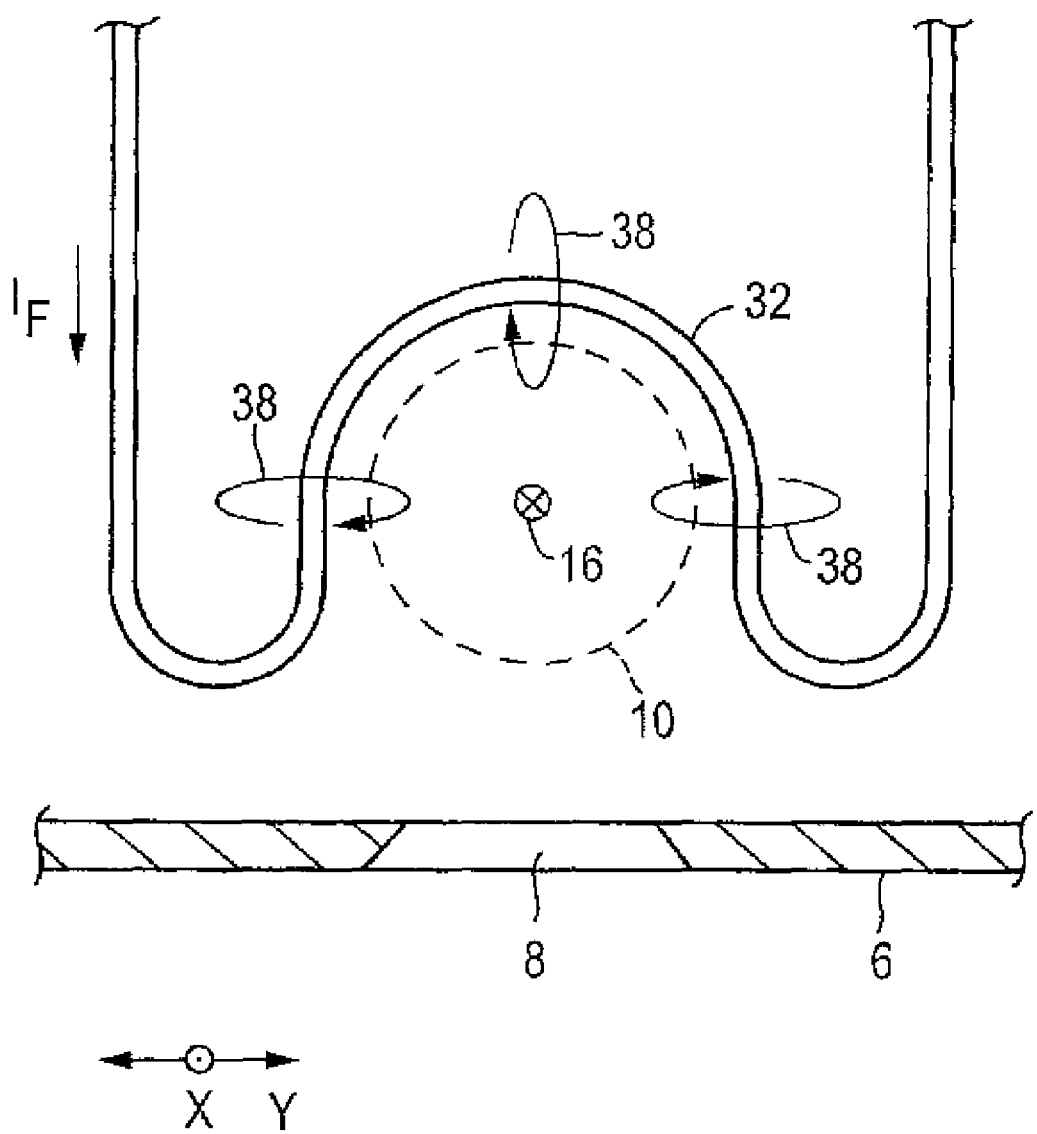
FIG. 4 is an enlarged view showing another example of a filament cathode.

Filament power sources 34 which supply filament currents IF to heat the filament cathodes 32 are connected to the filament cathodes 32, respectively. The filament power sources 34 may be DC power sources as in the illustrated example, or AC power sources. In the case where magnetic fields 38 are generated as shown in FIGS. 2 to 4 which will be described later, however, the filament power sources are DC power sources.

Between the filament cathodes 32 and the plasma generating chamber 6, a DC arc power source 36 which accelerates thermal electrons emitted from the filament cathodes 32, which ionizes the source gas introduced into the plasma generating chamber 6, and which causes an arc discharge to be generated in the plasma generating chamber 6, to generate the plasma 10 is connected while the filament cathodes 32 are set to the negative side. The arc power source 36 may be common to the plural filament cathodes 32 as in the embodiment, or individually disposed between the filament cathodes 32 and the plasma generating chamber 6.

By individually controlling (increasing or decreasing) the outputs of the filament power sources 34, i.e., by individually increasing or decreasing the filament currents IF supplied to the filament cathodes 32, the concentration of the plasma 10 can be controlled to control the density distribution of the plasma 10. In the case where arc power sources 36 are disposed respectively for the filament cathodes 32, the density distribution of the plasma 10 can be controlled by individually increasing or decreasing the outputs of the arc power sources 36.

An extraction electrode system 12 which extracts the ion beam 4 from the plasma 10 in the plasma generating chamber 6 is disposed in the vicinity of the exit of the ion extraction port 8. The extraction electrode system 12 is not restricted to a single electrode as in the illustrated example.

In the ion source 2a, the density of the whole plasma 10 can be increased or decreased by using the indirectly-heated cathodes 20. For example, the ion source is operated while the output voltages of the arc power sources 30 are set to a relatively high voltage which is equal to or higher than the ionization voltage (for example, about 20 V to 200 V) of objective ion species. Then, the density of the whole plasma 10 is increased or decreased by, for example, controlling (increasing or decreasing) the output voltages of the bombardment power sources 28.

According to the configuration, it is not required to increase the density of the whole plasma 10 by using the filament cathodes 32. Therefore, consumptions of the filament cathodes 32 can be suppressed by lowering the voltage applied from the arc power source 36 to the filament cathodes 32, and decreasing the filament currents IF supplied to the filament cathodes 32. For example, the ion source can be operated while the output voltage of the arc power source 36 is set to a voltage (for example, about 10 V to 60 V) which is lower than the output voltages of the arc power sources 30.

Moreover, the density distribution of the plasma 10 can be controlled by controlling the concentration of the plasma 10 by using the plural filament cathodes 32. For example, the density distribution of the plasma 10 can be uniformed by controlling the filament currents IF supplied to the filament cathodes 32.

As a result, the ion beam 4 in which the width W is wide, the beam current is large, and the uniformity of the beam current distribution in the direction of the width W is high can be generated. Moreover, consumptions of the filament cathodes 32 can be suppressed to prolong their lifetimes. Also in the indirectly-heated cathodes 20, as their original characteristics, the thicknesses of the cathode members 22 can be increased to prolong the lifetimes. Therefore, the lifetimes of the cathodes can be prolonged.

For example, the beam current distribution in the direction of the width W of the ion beam 4 can be measured by a beam measuring device 46 disposed at a position corresponding to the target 44. In the case where the beam measuring device 46 is disposed in rear of the target 44, during measurement, the target 44 may be moved to a position where it does not hinder the measurement. In the case where the beam measuring device 46 is disposed in front of the target 44, during ion beam irradiation on the target 44, the beam measuring device 46 may be moved to a position where it does not hinder the irradiation.

For example, the beam measuring device 46 is a multipoint beam measuring device in which many measuring devices (for example, Faraday cups) that measure the beam current of the ion beam 4 are juxtaposed in the X direction. Alternatively, the beam measuring device has a structure in which a single measuring device is moved in the X direction by a moving mechanism.

The control of the density distribution of the plasma by using the plural filament cathodes 32 may be manually performed, or automatically performed by using a controlling device 50 on the basis of measurement data obtained by the beam measuring device 46.

For example, the controlling device 50 controls the filament power sources 34 on the basis of measurement data obtained by the beam measuring device 46 to control the filament currents IF supplied to the filament cathodes 32 to control the concentration of the plasma 10, whereby the beam current distribution of the ion beam 4 in the direction of the width W is controlled. Specifically, the beam current distribution is uniformed.

In order to perform such a control, the controlling device 50 has a function of conducting at least one of: an operation in which the filament current IF supplied to the filament cathode 32 corresponding to a position where the beam current is relatively small is relatively increased; and that in which the filament current IF supplied to the filament cathode 32 corresponding to a position where the beam current is relatively large is relatively decreased.

In place of the above-described control function, the controlling device 50 may have a control function of uniforming the beam current distribution of the ion beam 4 in accordance with other control contents. For example, the controlling device may have a control function in which the beam current distribution of the ion beam 4 in the direction of the width W is uniformed by performing a control routine of making the average value of the beam current close to a preset value, and that of uniforming the beam current, such as disclosed in Patent Reference 2 above.

The control of increasing or decreasing the density of the whole plasma 10 by using the indirectly-heated cathodes 20 may be manually performed, or the controlling device 50 may have a control function of controlling the indirectly-heated cathodes 20 on the basis of measurement data obtained by the beam measuring device 46, or specifically controlling, for example, the bombardment power sources 28, thereby increasing or decreasing the density of the whole plasma 10.

As in the example shown in FIGS. 2 and 3, the filament cathodes 32 may have a shape in which the cathodes are bent back into a U-like shape in a plane substantially intersecting with the X direction. In this case, preferably, the filament cathodes 32 are supplied with the DC filament currents IF that cause the magnetic fields 38 produced by the currents flowing therethrough to be oriented in the direction in which the magnetic field 16 produced by the magnet 14 is enhanced. In this case, the filament power sources 34 are DC power sources.

When configured as described above, the magnetic field 16 produced by the magnet 14 can be enhanced by the magnetic fields 38 produced by the filament currents IF flowing through the filament cathodes 32. Therefore, the magnetic field in the plasma generating chamber 6 can be enhanced, and particularly the magnetic field 16 in the vicinity of the middle of the plasma generating chamber 6 in the X direction is enhanced, whereby the electron confining performance due to the magnetic field can be improved. As a result, the efficiency of ionizing the source gas is enhanced, and the increase of the plasma density and hence that of the ion beam current are facilitated. In the case where the ion beam 4 in which the width W is large is generated, particularly, the X-direction dimension of the plasma generating chamber 6, and hence the distance between the magnetic poles on the both sides is increased, so that the magnetic field 16 in the vicinity of the middle of the plasma generating chamber 6 is easily weakened. Therefore, an effect due to a phenomenon in which the magnetic field is reinforced by the magnetic field 38 is large.

Alternatively, the filament cathodes 32 may not have the above-described U-like shape, but have a shape in which tip end portions are bent back so as to form an Ω-like shape as in an example shown in FIG. 4. In the alternative, the same effects as those in the case of the U-like shape are achieved, and the following effect is further achieved. Even when the tip ends of the filament cathodes 32 are lowered toward the ion extraction port 8, it is possible to suppress the filament cathodes 32 from approaching the ion extraction port 8. Therefore, ions are easily extracted from the plasma 10 through the ion extraction port 8. This is caused because, when the filament cathodes 32 excessively approach the ion extraction port 8, extraction of ions is made difficult by the influence of ion sheaths in the vicinities of the filament cathodes 32.

Figure 5:
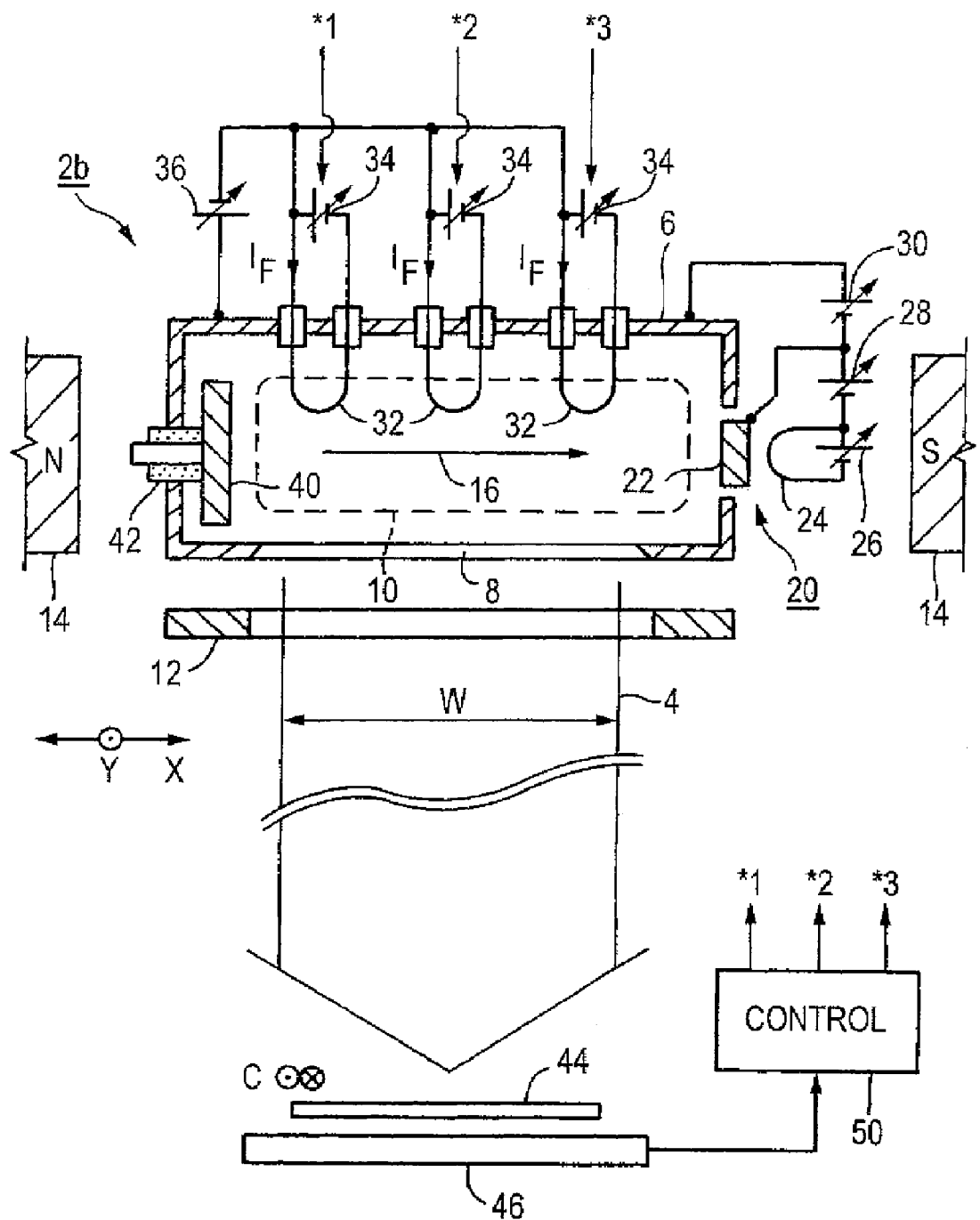
FIG. 5 is a view showing another example of an ion beam irradiating apparatus comprising the ion source of the invention.

In place of the placement where, as in the ion source 2a shown in FIG. 1, the indirectly-heated cathodes 20 are placed on the both sides of the plasma generating chamber 6 in the X direction, an indirectly-heated cathode 20 may be placed on one side in the X direction, and a reflecting electrode 40 may be placed on the opposite side, i.e., on the other side in the X direction so as to be opposed to the indirectly-heated cathode 20 as in an ion source 2b shown in FIG. 5. In FIG. 5, the identical or corresponding parts as those of the example of FIGS. 1 to 4 are denoted by the same reference numerals, and duplicated description will be omitted.

The reflecting electrode 40 is electrically insulated from the plasma generating chamber 6 by an insulator 42. As in this example, the reflecting electrode 40 may be connected to nothing so as to be set at a floating potential, or connected to the opposite cathode member 22 (in other words, the negative pole end of the arc power source 30) so as to be set at the cathode potential. Even when the reflecting electrode 40 is set at a floating potential, thermal electrons which are emitted mainly from the cathode member 22, and which have a high energy corresponding to the output voltage of the arc power source 30 impinge on the reflecting electrode 40, and the electrode is charged to a negative potential.

The reflecting electrode 40 has a negative potential with respect to the plasma generating chamber 6, and functions to reflect (repel) electrons (thermal electrons which are emitted mainly from the indirectly-heated cathode 20 and the filament cathodes 32) in the plasma generating chamber 6. When the reflecting electrode 40 is disposed, therefore, electrons reciprocally move between the indirectly-heated cathode 20 (more specifically, the cathode member 22 of the electrode) and the reflecting electrode 40 while circling in the magnetic field 16 about the direction of the magnetic field 16. As a result, the probability of collision between the electrons and molecules of the source gas is increased to enhance the efficiency of ionizing the source gas, and therefore the generation efficiency of the plasma 10 is enhanced. Even when the indirectly-heated cathode 20 is disposed on one side, therefore, it is possible to achieve effects similar to those in the case where the cathodes are disposed on the both side, i.e., effects similar to the above-described ones achieved by the ion source 2a.

In the above, the methods of operating the ion sources 2a, 2b have been substantially described. However, the methods are summarized as follows. That is, the density of the whole plasma 10 generated in the plasma generating chamber 6 is increased or decreased by using the indirectly-heated cathode 20, and the density distribution of the plasma 10 generated in the plasma generating chamber 6 is controlled by using the plural filament cathodes 32. With respect to the ion sources 2a, 2b, therefore, the same effects as those described above can be achieved.

The invention claimed is:

1. An ion source which generates an ion beam having a shape where a dimension in an X direction in a plane intersecting with a traveling direction is larger than a dimension in a Y direction perpendicular to the X direction, wherein said ion source comprises:
   a plasma generating chamber which is a chamber that functions also as an anode, and that is used for internally generating a plasma, said chamber having an ion extraction port extending in the X direction;
   a magnet which generates a magnetic field extending along the X direction, in said plasma generating chamber;
   indirectly-heated cathodes which are placed respectively on both sides of said plasma generating chamber in the X direction, and which are used for generating the plasma in said plasma generating chamber, and increasing or decreasing a density of a whole of the plasma; and
   plural filament cathodes which are juxtaposed in the X direction in said plasma generating chamber, and which are used for generating the plasma in said plasma generating chamber, and controlling a density distribution of the plasma.

2. An ion source according to claim 1, wherein each of said filament cathodes has a shape in which said filament cathode is bent back in a plane substantially intersecting with the X direction, and said filament cathode is supplied with a DC current that causes the magnetic field produced by the current flowing through said filament cathode to be oriented in a direction in which the magnetic field produced by said magnet is enhanced.

3. A method of operating an ion source wherein, in an ion source according to claim 2,
   the density of the whole of the plasma generated in said plasma generating chamber is increased or decreased by using said indirectly-heated cathodes, and
   the density distribution of the plasma generated in said plasma generating chamber is controlled by using said plural filament cathodes.

4. A method of operating an ion source wherein, in an ion source according to claim 1,
   the density of the whole of the plasma generated in said plasma generating chamber is increased or decreased by using said indirectly-heated cathodes, and
   the density distribution of the plasma generated in said plasma generating chamber is controlled by using said plural filament cathodes.

5. An ion source which generates an ion beam having a shape where a dimension in an X direction in a plane intersecting with a traveling direction is larger than a dimension in a Y direction perpendicular to the X direction, wherein said ion source comprises:
   a plasma generating chamber which is a chamber that functions also as an anode, and that is used for internally generating a plasma, said chamber having an ion extraction port extending in the X direction;
   a magnet which generates a magnetic field extending along the X direction, in said plasma generating chamber;
   an indirectly-heated cathode which is placed on one side of said plasma generating chamber in the X direction, and which is used for generating the plasma in said plasma generating chamber, and increasing or decreasing a density of a whole of the plasma;
   a reflecting electrode which is placed in said plasma generating chamber and on another side in the X direction to be opposed to said indirectly-heated cathode, and which reflects electrons in said plasma generating chamber; and
   plural filament cathodes which are juxtaposed in the X direction in said plasma generating chamber, and which are used for generating the plasma in said plasma generating chamber, and controlling a density distribution of the plasma.

6. An ion source according to claim 5, wherein each of said filament cathodes has a shape in which said filament cathode is bent back in a plane substantially intersecting with the X direction, and said filament cathode is supplied with a DC current that causes the magnetic field produced by the current flowing through said filament cathode to be oriented in a direction in which the magnetic field produced by said magnet is enhanced.

7. A method of operating an ion source wherein, in an ion source according to claim 6,
   the density of the whole of the plasma generated in said plasma generating chamber is increased or decreased by using said indirectly-heated cathode, and
   the density distribution of the plasma generated in said plasma generating chamber is controlled by using said plural filament cathodes.

8. A method of operating an ion source wherein, in an ion source according to claim 5,
   the density of the whole of the plasma generated in said plasma generating chamber is increased or decreased by using said indirectly-heated cathode, and
   the density distribution of the plasma generated in said plasma generating chamber is controlled by using said plural filament cathodes.

* * * * *